US006911404B2

United States Patent
Wieczorek et al.

(10) Patent No.: US 6,911,404 B2
(45) Date of Patent: Jun. 28, 2005

(54) TRANSISTOR ELEMENT HAVING AN ANISOTROPIC HIGH-K GATE DIELECTRIC

(75) Inventors: Karsten Wieczorek, Dresden (DE); Christian Radehaus, Chemnitz (DE)

(73) Assignee: Advanced Micro Devices, Inc., Austin, TX (US)

( * ) Notice: Subject to any disclaimer, the term of this patent is extended or adjusted under 35 U.S.C. 154(b) by 74 days.

(21) Appl. No.: 10/403,556

(22) Filed: Mar. 31, 2003

(65) Prior Publication Data

US 2004/0041196 A1 Mar. 4, 2004

(30) Foreign Application Priority Data

Sep. 2, 2002 (DE) .......................................... 102 40 408

(51) Int. Cl.[7] ..................... H01L 21/31; H01L 21/8238; H01L 21/3205
(52) U.S. Cl. ....................... 438/785; 438/216; 438/261; 438/421; 438/591; 438/595; 257/410; 257/411
(58) Field of Search ............................ 438/3, 216, 261, 438/421, 591, 595, 287, 785; 257/410, 411, 295

(56) References Cited

U.S. PATENT DOCUMENTS

| 4,200,474 A | 4/1980 | Morris ........................ 148/1.5 |
| 6,262,462 B1 * | 7/2001 | Marshall et al. ............. 257/410 |
| 2002/0000593 A1 | 1/2002 | Nishiyama et al. ......... 257/296 |
| 2002/0093046 A1 | 7/2002 | Moriya et al. ............... 257/315 |

FOREIGN PATENT DOCUMENTS

| WO | WO 02/41378 A2 | 5/2002 | ........... H01L/21/28 |
| WO | WO 02/054495 A2 | 7/2002 | ........... H01L/29/00 |

OTHER PUBLICATIONS

IBM Technical Disclosure Bulletin, "Process for Fabricating Small High Value Capacitors," vol. 32, No. 4B, Sep. 1989.

* cited by examiner

Primary Examiner—DongHee Kang
(74) Attorney, Agent, or Firm—Williams, Morgan & Amerson, P.C.

(57) ABSTRACT

A field effect transistor comprises a gate insulation layer including an anisotropic dielectric. The orientation is selected such that a first permittivity parallel to the gate insulation layer is significantly less than a second permittivity perpendicular to the gate insulation layer.

8 Claims, 2 Drawing Sheets

TRANSISTOR ELEMENT HAVING AN ANISOTROPIC HIGH-K GATE DIELECTRIC

BACKGROUND OF THE INVENTION

1. Field of the Invention

Generally, the present invention relates to the fabrication of highly sophisticated integrated circuits including transistor elements with minimum feature sizes of 0.1 μm and less, and, more particularly, to highly capacitive gate structures including a dielectric with a thickness of an oxide capacitance equivalent thickness of 2 nm and less.

2. Description of the Related Art

In modem integrated circuits, minimum feature sizes are steadily decreasing and presently approach 0.1 μm with the prospect of 0.08 μm in the near future. Of the many problems encountered in steadily decreasing feature sizes, one essential issue has to be resolved to allow the further scaling of device dimensions as will be explained in the following. Presently, the vast majority of integrated circuits are based on silicon, due to substantially unlimited availability, the well-understood characteristics and the experience gathered during the last 50 years, and, therefore, silicon will remain the material of choice for future circuit generations. One reason for the dominant importance of silicon in fabricating semiconductor devices is the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

Most modern integrated circuits comprise a huge number of field effect transistors, wherein, for the reasons pointed out above, silicon dioxide is preferably used as a gate insulation layer separating a polysilicon gate electrode from a silicon channel region. In steadily improving device performance of field effect transistors, a length of this channel region has continuously been decreased to improve switching speed and drive current capability. Since the transistor performance is controlled by a voltage supplied to the gate electrode to invert the surface of the channel region to a sufficiently high charge density for providing, the desired current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a dependence of the threshold voltage on the channel length. Aggressively scaled transistor devices with a relatively low supply voltage and thus reduced threshold voltage may, therefore, suffer from an exponential increase of the leakage current so that the capacitive coupling of the gate electrode to the channel region has to be correspondingly increased to substantially avoid the short channel behavior. Thus, the thickness of the silicon dioxide layer has to be correspondingly decreased to provide for the required capacitance between the gate and the channel region. For example, a channel length of 0.13 μm requires a silicon dioxide thickness in the range of approximately 2–3 nm, and a gate length of 0.08 μm may require a gate dielectric made of silicon dioxide as thin as approximately 1.2 nm. Although generally high speed transistor elements having an extremely short channel may preferably be used for high speed applications, whereas transistor elements with a longer channel may be used for less critical applications, such as storage transistor elements, the relatively high leakage current caused by direct tunneling of charge carriers through an ultra thin silicon dioxide gate insulation layer may reach values for an oxide thickness in the range of 1–2 nm that are not acceptable for performance-driven circuits.

Therefore, replacing silicon dioxide as the material for gate insulation layers has been considered, particularly for extremely thin silicon dioxide gate layers. Possible alternative materials include materials that exhibit a significantly higher permittivity so that a physically higher thickness of a correspondingly formed gate insulation layer provides for a capacitive coupling that would be obtained by an extremely thin silicon dioxide layer. Commonly, a thickness required for achieving a specified capacitive coupling with silicon dioxide is referred to as capacitance equivalent thickness (CET). Thus, at a first glance, it appears that simply replacing the silicon dioxide with a high-k material is a straightforward way to obtain a capacitance equivalent thickness in the range of 1 nm and less. One approach in this respect is the introduction of nitrogen into a silicon dioxide layer to thereby increase the dielectric constant. However, reliably placing nitrogen into an extremely thin silicon dioxide layer without penetrating the underlying channel region renders this approach not very promising. Moreover, introducing nitrogen into the silicon dioxide decreases the band gap, so that for a given maximum leakage current, only a modest increase of the gate capacitance may be achieved.

It is, thus, suggested replacing silicon dioxide with high permittivity materials such as tantalum oxide ($Ta_2O_5$) with a k of approximately 25 and strontium titanium oxide ($SrTiO_3$) having a k of approximately 150. When applying such high permittivity materials as gate dielectric, it turns out that, in addition to a plurality of problems involved in integrating the handling of these materials into well-established process sequences, the carrier mobility in the channel region is significantly affected by these high permittivity materials. Thus, although a high capacitive coupling is provided, device performance of these transistor elements is degraded by the reduced carrier mobility, thereby at least partially offsetting the advantage obtained by using the high permittivity material.

It thus appears that for the future scaling of transistor elements, a high capacitive coupling is required, wherein, on the other hand, the carrier mobility determining the drive current capability of the transistor device is not unduly negatively influenced.

SUMMARY OF THE INVENTION

Generally, the present invention is based on the inventors' finding that a high permittivity of the gate dielectric, caused by weakly bound charged clouds of the dielectric material, may effectively be restricted to an angular range substantially perpendicular to the flow direction of the charge carriers in the channel region. Since the capacitive coupling between the gate electrode and the channel region is substantially determined by the electromagnetic interaction of the weakly bound charge clouds with charge carriers, an inversion layer is effectively generated, whereas a lateral coupling of the charge clouds in the dielectric with the charge carriers in the channel region is maintained low.

According to one illustrative embodiment of the present invention, a field effect transistor comprises a gate insulation layer formed above an active region and including a high-k dielectric, wherein a permittivity of the high-k dielectric perpendicular to the gate insulation layer is higher than a permittivity parallel to the gate insulation layer.

According to a further illustrative embodiment, a method of forming a high-k gate insulation layer above a substrate comprises epitaxially growing an anisotropic dielectric material having a first permittivity along a first direction and a second permittivity along a second direction, wherein the second permittivity is higher than the first permittivity. At least one process parameter is controlled to adjust the second direction substantially perpendicular to a surface of the substrate.

According to another illustrative embodiment of the present invention, a method of forming a high-k dielectric gate insulation layer comprises providing a substrate having formed thereon an active semiconductor region. An anisotropic dielectric material is then deposited to form a dielectric layer and the substrate is subsequently annealed. At least one process parameter of at least one of depositing and annealing the substrate is controlled to adjust a crystalline orientation such that a first permittivity oriented parallel to the dielectric layer is less than a second permittivity oriented perpendicular to the dielectric layer.

According to yet another embodiment, a method of forming a gate insulation layer having a capacitance equivalent thickness of less than approximately 2 nm comprises selecting a crystalline dielectric having a different permittivity in at least two different directions. The method further includes determining a process parameter setting for forming the crystalline dielectric above a substrate such that a direction corresponding to the higher permittivity is substantially perpendicular to a surface of the substrate. Finally, the crystalline dielectric is formed in conformity with the parameter setting.

According to still a further illustrative embodiment of the present invention, a field effect transistor comprises a gate insulation layer having a capacitance equivalent thickness of less than 2 nm, wherein the gate insulation layer includes a dielectric layer. A ratio of a permittivity perpendicular to the dielectric layer to a permittivity parallel to the dielectric layer is equal to or higher than 1.2.

BRIEF DESCRIPTION OF THE DRAWINGS

The invention may be understood by reference to the following description taken in conjunction with the accompanying drawings, in which like reference numerals identify like elements, and in which.

Figure 1A:
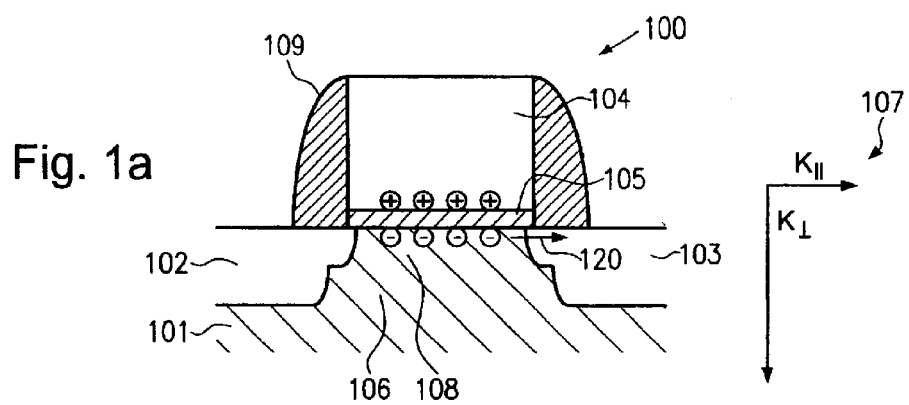
FIG. 1*a* schematically shows a cross-sectional view of a field effect transistor including an anisotropic gate dielectric.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Currently, great efforts are being made to find materials allowing the replacement of silicon dioxide and/or silicon oxynitride to obtain a capacitance equivalent thickness of 2 nm and beyond as is required for a channel length of 0.1 $\mu$m and less. A plurality of candidates have been identified so far, such as zirconium oxide, hafnium oxide, titanium oxide and the like. However, although the employment of these high-k materials seems to indicate that a capacitance equivalent thickness of less than 2 nm may be achieved without increasing the leakage current, it appears that conventional approaches do not offer a solution for reduced carrier mobility in the channel region.

The present invention is, therefore, based on the concept of taking into account, in addition to an increased absolute permittivity, the directionality of the permittivity to thereby significantly affect the interaction of the charge carriers, such as electrons, with the dielectric material when moving from the source to the drain region.

Figure 1B:
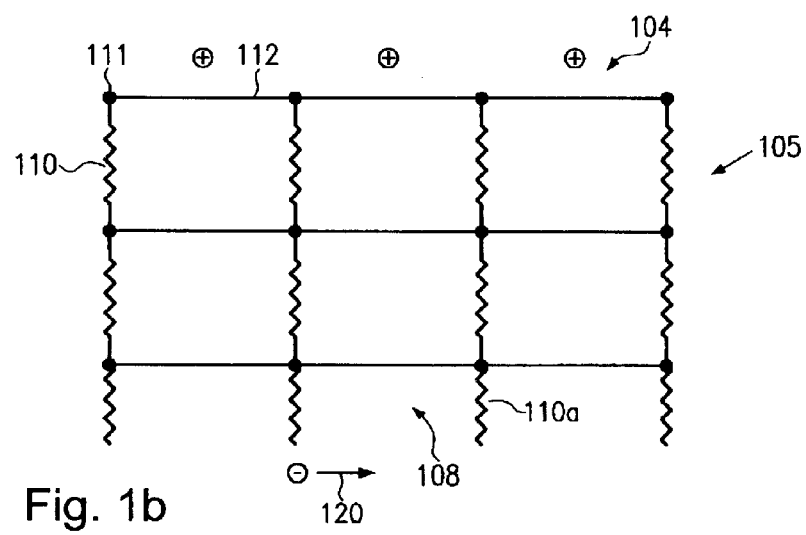
FIG. 1*b* schematically shows a simplified model of the anisotropic dielectric.
Figure 1C:
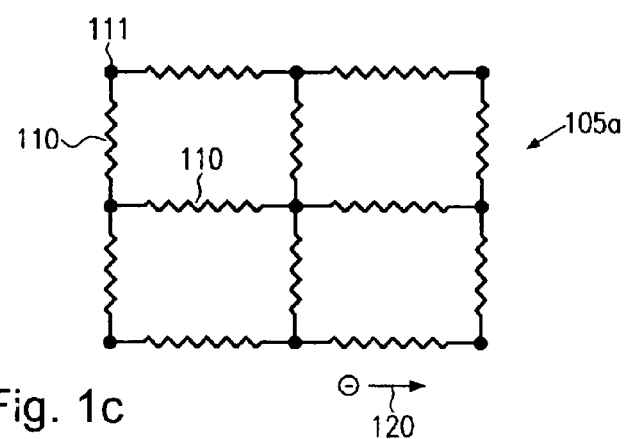
FIG. 1*c* shows a simplified model of a conventional substantially isotropic dielectric.

With reference to FIG. 1*a*–1*c*, the concept of the present invention will now be described in more detail. In FIG. 1*a*, a field effect transistor 100 comprises a substrate 101 including an active region 106, typically a silicon-based semiconductor material. For convenience, the transistor 100 is illustrated as an N-channel type. The present invention applies to P-channel transistors as well. Moreover, a source region 102 and a drain region 103 are formed in the active region 106. A gate electrode 104, for example comprised of polysilicon or any other appropriate conductive material, is formed over the active region 106 and is separated therefrom by a gate insulation layer 105 comprising an anisotropic dielectric material, such as a crystalline metal-containing oxide or silicate, or ferro-electric materials, or optically anisotropic materials, and the like. The anisotropic dielectric of the gate insulation layer 105 may have a first permittivity $k_{parallel}$ that is oriented substantially parallel to the gate insulation layer 105, and a second permittivity $k_{orthogonal}$ in a direction substantially perpendicular to the gate insulation layer 105, wherein $k_{parallel}$ is lower than $k_{orthogonal}$, as indicated by reference sign 107.

In operation, a voltage is applied to the gate electrode 104 and to the active region 106. For convenience, it is assumed that the source region 102 and the active region 106 are tied to a common reference potential so that, for the N-channel transistor 100 shown in FIG. 1a, a positive voltage may lead to the formation of a conductive channel 108 at the interface between the gate insulation layer 105 and the active region 106. Due to the high permittivity $k_{orthogonal}$, the gate insulation layer 105 provides a high capacitive coupling of the gate electrode 104 to the channel 108, while the increased physical thickness of the gate insulation layer 105 compared to the capacitance equivalent thickness of 2 nm and less maintains leakage currents from the channel 108 into the gate electrode 105 at an acceptable level. Since the permittivity $k_{parallel}$ is significantly lower than the permittivity $k_{orthogonal}$ perpendicular to the flow direction of the charge carriers, the electromagnetic coupling to the gate dielectric is significantly lower in the flow direction, as indicated by the arrow 120, as will be discussed in more detail with reference to FIGS. 1b and 1c.

FIG. 1b shows a simplified model of a portion of the gate insulation layer 105. In this model, the gate insulation layer 105, including the anisotropic dielectric, is represented by a two-dimensional grid in which lattices sites are represented by dots 111 that are coupled to the nearest neighbors by springs 110 in the vertical direction and by bars 112 in the horizontal direction. Representing the permittivity $k_{parallel}$ by the inelastic bars 112 is selected for convenience, so as to avoid the introduction of two different types of springs having a different strength. It should be appreciated, however, that the $k_{parallel}$ may be represented by "stronger" springs, indicating less sensitivity to external electromagnetic fields. The springs 110 and the bars 112 are to represent charge clouds and the corresponding ability to interact with a charged particle. Upon application of a positive voltage to the gate electrode 104, the corresponding springs 110 will deform, i.e., the charge clouds will be unbalanced, so that an electron is attracted and is tied to the channel region 108. When a voltage is established between the source and drain region, the electron will move under the influence of this electric field and will move to the adjacent spring 110a so that the electron remains coupled to the gate insulation layer 105 in the vertical direction. Since the bars 112 do not allow any deformation, at least in this simplified model, substantially no coupling occurs in the horizontal direction and thus the horizontal motion of the electron is not substantially affected.

FIG. 1c shows this situation for a substantially isotropic gate insulation layer 105a. Since, in this case, the electron may deform the horizontally oriented springs 110, as well as the vertical oriented springs, a certain amount of coupling is present in both directions and results in a reduced mobility of the electrons in the flow direction.

Thus, by providing a dielectric material in the gate insulation layer 105 having a significant anisotropy with respect to the parallel and orthogonal directions, the charge carrier mobility in the channel region 108 is significantly less deteriorated, and thus the transistor performance is increased, compared to a conventional device having an isotropic dielectric. Even if in the conventional device a dielectric material of comparable permittivity is used, or even if the same material is used as in the transistor 100 without, however, suitably adjusting the corresponding orientation of the dielectric material, the carrier mobility is reduced compared to the transistor 100.

Figure 2:
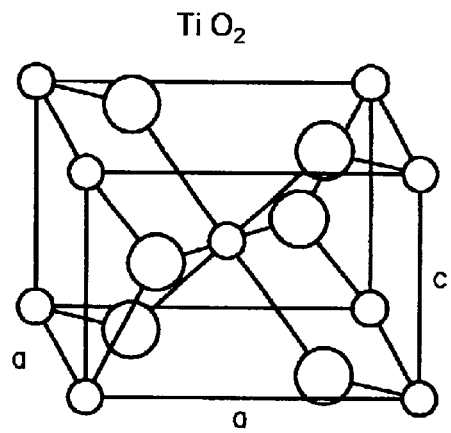
FIG. 2 depicts an elementary cell of a titanium dioxide crystal.

FIG. 2 shows an example for an anisotropic dielectric material. In FIG. 2, an elementary cell of a titanium dioxide ($TiO_2$) is shown in the so-called rutile form. In this crystalline form, titanium dioxide is tetragonal with lattice constants a and c, as indicated in FIG. 2, of 0.4594 nm and 0.2958 nm, respectively. Moreover, a permittivity along the c axis is less than a permittivity along the a axis with a ratio of the a axis permittivity to the c axis permittivity of approximately 2 at room temperature. The k value of the permittivity is, approximately 60 and may depend on growth parameters and the specific arrangement of the gate insulation layer 105. Typically, titanium dioxide may be deposited by chemical vapor deposition using precursor gases such as titanium tetrakis isopropoxide (TTIP) and titanium nitrate. By maintaining the substrate temperature at 660° C. and higher, titanium dioxide is substantially deposited in the rutile form. Alternatively, or additionally, the substrate may be annealed within a temperature range of approximately 700–900° C. to transform the titanium dioxide layer into a crystalline layer substantially exhibiting the rutile form.

A typical process flow with the above-described deposition scheme for forming the field effect transistor 100 including, for example, a titanium dioxide layer in a crystalline rutile form may comprise the following steps. First, shallow trench isolations (not shown) may be formed to define the active region 106. After an implantation sequence for defining the vertical dopant profile in the active region 106, the gate insulation layer 105 is deposited on the substrate 101. For the above example, the gate insulation layer 105 comprises titanium dioxide, and it may be advantageous to deposit a thin barrier layer in order to ensure thermal stability of the titanium dioxide. For example, one or two atomic layers of silicon dioxide or silicon nitride, or zirconium silicate and the like, may be deposited on the substrate 101. Subsequently, titanium dioxide is deposited, for example with chemical vapor deposition as described above, wherein process parameters are adjusted to obtain a crystalline growth with the c axis substantially oriented perpendicular to the surface of the substrate 101. A corresponding parameter setting depends on the crystal orientation of the substrate 101, the type of barrier layer and the deposition conditions and possibly on anneal conditions. Thus, the crystal orientation upon growing and/or annealing of the titanium dioxide may be established by experiment and/or by theory, for example by means of simulation calculations.

Alternatively, the titanium dioxide may substantially be deposited at moderate temperatures and may crystallize in subsequent anneal cycles. After deposition of the titanium dioxide, depending on the process recipe, an anneal cycle may be carried out to provide for the required crystallinity. In depositing the titanium dioxide, a thickness is controlled so as to obtain the required capacitance equivalent thickness. As previously pointed out, the effective permittivity $k_{orthogonal}$ and $k_{parallel}$ may depend on the deposition specifics and on the type of barrier material used. Typical values are in the range of 20–70. Subsequently, a polysilicon layer may be deposited and patterned by well-established photolithography and etch techniques to form the gate electrode 104. Thereafter, the field effect transistor 100 may be completed by well-known implantation, spacer and anneal techniques.

Figure 3:
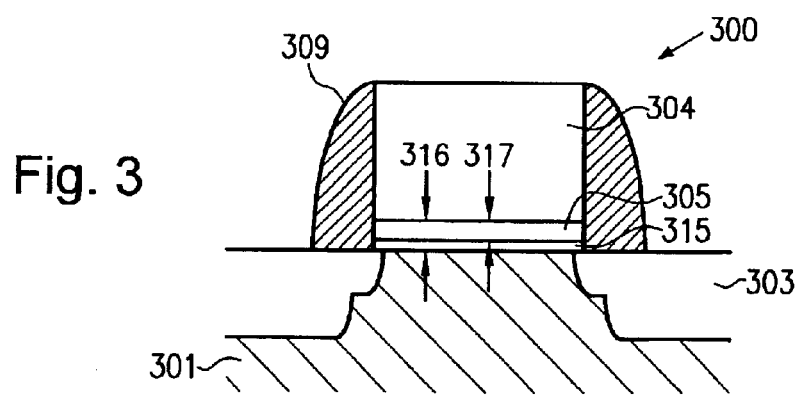
FIG. 3 schematically shows a field effect transistor having a gate dielectric according to a further illustrative embodiment of the present invention.

FIG. 3 illustrates a schematic cross-sectional view of a further example of a field effect transistor 300 having a gate dielectric comprised of an anisotropic high-k material layer 305 and a barrier layer 315 in the form of an extremely thin silicon dioxide layer formed on a silicon substrate 301. The transistor 300 further comprises a gate electrode 304 formed on the anisotropic dielectric layer 305 and sidewall spacers 309. Source and drain regions 303 are formed within the substrate 301. A combined thickness 316 of the layers 305 and 315 is selected to correspond to a capacitance equivalent thickness in the range of approximately 1–1.5 nm., Since the barrier layer 315 already "consumes" a portion of the capacitance equivalent thickness, typically on the order of 0.5 nm for one or two atomic layers, an effective thickness of the anisotropic dielectric layer 305 may be in the range of approximately 3–5 nm, thereby providing a leakage current that substantially corresponds to a silicon dioxide layer of 2 nm and more. Thus, the transistor element 300 allows scaling of the gate length well beyond 0.1 $\mu$m while maintaining the leakage current at a level of present cutting-edge devices. Due to the anisotropic behavior of the dielectric layer 305, carrier mobility may be comparable to silicon dioxide-based devices. By providing the silicon dioxide barrier layer 315, the transistor element 300 is reliable due to the silicon/silicon dioxide interface and a manufacturing process thereof is highly compatible with presently established process techniques.

As a result, the present invention provides sophisticated transistor elements allowing a gate length of 0.1 $\mu$m and less by providing different permittivities parallel and perpendicular to the gate insulation layer, wherein preferably a ratio of the $k_{orthogonal}$ to the $k_{parallel}$ is higher than 1.2 to achieve a significant effect on the charge carrier mobility improvement with respect to capacitance increase and leakage reduction. Preferably, the anisotropy of the dielectric gate material is selected in accordance with process requirements and the desired target CET. For example, the necessity for a barrier layer may dictate a minimum k value to achieve the target CET, wherein the anisotropy has to meet the operational requirements. For instance, high performance applications may require a high anisotropy to optimize carrier mobility, while leakage currents are still within reasonable limits due to a moderate permittivity, such as the permittivity of titanium dioxide, compared to materials of extremely high values on the order of 100, however, with less pronounced anisotropy.

Moreover, the crystallinity of the high-k dielectric may be adjusted so that the required orientation is obtained. Preferably, the deposition kinetics, the type of barrier layer, if required, the crystalline structure of the substrate, and the like, may be taken into account, for example, by modeling and/or experiment, to adjust the physical thickness in accordance with the target capacitance equivalent thickness. In other embodiments, the orientation and/or the crystalline structure may be adjusted by providing one or more sub-layers of one or more different materials. For example, it may be necessary to provide a suitable crystalline structure for depositing the high-k material so as to take on the required orientation. Accordingly, one or more "transition" layers may then be provided to finally provide a deposition basis for obtaining the desired orientation of the "bulk" material having the high k-value.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a high-k dielectric gate insulation layer, the method comprising:

providing a substrate having formed thereon an active semiconductor region;

depositing an anisotropic dielectric material to form a dielectric layer;

annealing said substrate; and controlling at least one process parameter of at least one of depositing and annealing said substrate to adjust a crystalline orientation such that a first permittivity oriented parallel to said dielectric layer is less than a second permittivity oriented perpendicularly to said dielectric layer.

2. The method of claim 1, wherein said dielectric comprises titanium oxide.

3. The method of claim 1, wherein depositing said anisotropic dielectric is carried out at a temperature in the range of approximately 700–900° C.

4. The method of claim 1, wherein said annealing is carried out with a temperature in the range of approximately 600–800° C.

5. The method of claim 1, wherein a ratio of said second permittivity to said first permittivity is equal to or higher than 1.2.

6. A method of forming a high-k dielectric gate insulation layer, the method comprising:

providing a substrate having formed thereon an active semiconductor region;

depositing an anisotropic dielectric material to form a dielectric layer, said depositing performed at a temperature in a range of approximately 700–900° C.;

annealing said substrate at a temperature in a range of approximately 600–800° C.; and controlling at least one process parameter of at least one of depositing and annealing said substrate to adjust a crystalline orientation such that a first permittivity oriented parallel to said dielectric layer is less than a second permittivity oriented perpendicularly to said dielectric layer.

7. The method of claim 6, wherein said dielectric comprises titanium oxide.

8. The method of claim 6, wherein a ratio of said second permittivity to said first permittivity is equal to or higher than 1.2.

* * * * *